(12) United States Patent
Stillman et al.

(10) Patent No.: US 8,344,749 B2
(45) Date of Patent: Jan. 1, 2013

(54) THROUGH CARRIER DUAL SIDE LOOP-BACK TESTING OF TSV DIE AFTER DIE ATTACH TO SUBSTRATE

(75) Inventors: Daniel Joseph Stillman, Garland, TX (US); James L. Oborny, Sachse, TX (US); William John Antheunisse, Rowlett, TX (US); Norman J. Armendariz, Plano, TX (US); Ramyanshu Datta, San Jose, TX (US); Kenneth M. Butler, Richardson, TX (US); Margaret Simmons-Matthews, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 424 days.

(21) Appl. No.: 12/795,376

(22) Filed: Jun. 7, 2010

(65) Prior Publication Data
US 2011/0298488 A1 Dec. 8, 2011

(51) Int. Cl.
*G01R 31/02* (2006.01)
(52) U.S. Cl. .............. 324/762.02; 324/762.03
(58) Field of Classification Search .. 324/762.01–762.1, 324/750.01–750.3, 754.01–754.3, 756.01–756.05; 257/48; 438/14–18; 174/360
See application file for complete search history.

(56) References Cited

U.S. PATENT DOCUMENTS

| 7,459,924 | B2 | 12/2008 | Johnson |
| 7,501,839 | B2 * | 3/2009 | Chan et al. ............. 324/754.18 |
| 7,579,852 | B2 | 8/2009 | Johnson |
| 8,183,087 | B2 * | 5/2012 | Lin et al. ............. 438/106 |

* cited by examiner

Primary Examiner — Tung X Nguyen
(74) Attorney, Agent, or Firm — Steven A. Shaw; W. James Brady; Frederick J. Telecky, Jr.

(57) ABSTRACT

A method of testing electronic assemblies including singulated TSV die attached to a ML package substrate, on a substrate carrier. The substrate carrier includes through-holes for allowing probe contact to the BGA substrate pads on a bottomside of the package substrate that are coupled to the frontside of the TSVs. Contactable TSV tips on the bottomside of the TSV die are contacted with a topside coupler that includes a pattern of coupling terminals that matches a layout of at least a portion of the TSV tips or pads coupled to the TSV tips. The topside coupler electrically connects pairs of coupling terminals to provide a plurality of TSV loop back paths. The BGA substrate pads are contacted with a plurality of probes tips that extend through the through-holes to couple to the frontside of the TSVs. Electrical testing is performed across the electronic assembly to obtain at least one test parameter.

22 Claims, 4 Drawing Sheets

THROUGH CARRIER DUAL SIDE LOOP-BACK TESTING OF TSV DIE AFTER DIE ATTACH TO SUBSTRATE

FIELD

Disclosed embodiments relate to integrated circuits (ICs), and more particularly to testing electronic assemblies during Package on Package (PoP) assembly processing.

BACKGROUND

PoP is an integrated circuit (IC) packaging technique that allows vertically stacking of IC packages, such as a discrete logic ball grid array (BGA) package and a memory BGA package. Two or more packages are installed on top of one another, i.e. vertically stacked, with a standard interface to route signals between them. This allows higher density, for example for mobile telephone/PDA market applications.

Through substrate via (TSV)-containing IC die such as microprocessors TSV die in a PoP flow are generally not yet in production. However, the assembly flow for a conventional PoP sequence for a wafer having a plurality of TSV die (a "TSV wafer") can be expected to be as follows:

1. Wafer probe ("multiprobe") the respective die on a thick TSV wafer (e.g., 600 to 800 μm thick) having embedded TSVs to identify good die on the basis of electrical tests. Electronic Inking where the die are tracked on stored wafer maps may be used for subsequent identification of "bad" die.
2. Singulate the TSV wafer to provide a plurality of singulated "good" TSV die.
3. Die attach the good TSV die identified at wafer probe active circuit side down to a multi-layer (ML) package substrate that includes BGA pads on its bottom side that is attached to a carrier (typically a silicon or glass carrier) to form a PoP precursor. The carrier provides rigidity.
4. Expose the embedded TSVs by thinning the bottomside of the TSV die (e.g. to about 30 to 100 μm) to form a thinned PoP precursor having contactable TSV tips. The active circuit side (i.e., frontside) of the TSV die is not electrically accessible via the package substrate due to the presence of the carrier.
5. Ship the thinned PoP precursor to a customer.
6. The customer (or its contactor) then (i) adds one or more die, such as a memory die, on top of the TSV die to make contact with the TSV tips or contact pads coupled to the TSV tips to form the PoP, and then (ii) the customer (or its contactor) removes the carrier and adds a BGA on the BGA pads of the package substrate.

Steps 3 and 4 in the above-described flow can result in electrical problems including TSV formation problems (e.g., missing TSVs), TSV contact problems (e.g., high resistance contacts) or shorts (e.g., TSV shorts to ground) that can only be detected after assembly of the top die to complete the PoP because as noted above the carrier while present blocks access to one side of the TSV die. The package substrate can also be the source of certain problems. Probing after die attach of the TSV die can be omitted. However, this will result in shipping some fraction of bad thinned PoP precursors onto step 6 described above for customer's assembly (e.g., where costly pre-packaged memory stacks may be added), that due electrical problems such as those described above that can result in failures at final PoP testing. There are no known practical solutions. What is needed is a method to test thinned PoP precursors to allow testing of the TSV die and one or more test parameters (e.g., including test parameters associated with the die attach process) of the TSV die while the carrier is present.

SUMMARY

Disclosed embodiments solve or at least substantially solve problems stemming from the inability to test singulated TSV die flip chip die attached to the package substrate during the PoP assembly process due to the presence of the substrate carrier. Having through-holes in the substrate carrier that align with the Ball Grid Array (BGA) pads of the package substrate provides contact to the face down frontside (circuit side) of the TSVs. A topside coupler is provided to couple to contactable TSV surfaces on the bottomside of the TSV die. As used herein, the term "contactable TSV tips" includes protruding, flush or recessed tips. The TSV tips can be contacted directly such when the tips are protruding TSV tips (e.g., protruding copper tips with a Pd, Au or solder outer tip surface) or indirectly contactable TSV tips, such when the tips are flush or recessed and there are pads coupled to the tips, whether the pads are directly over the TSV tips or lateral to the TSV tips using a redirect layer (RDL) for coupling.

Disclosed methods include methods of testing an electronic assembly comprising a singulated TSV die flip chip attached to a ML package substrate on a substrate carrier. The TSVs extend from a back end of the line (BEOL) metal layer (e.g., M1) within a frontside of the TSV die to a bottomside of the TSV die that has contactable TSV tips, wherein the frontside of the TSVs are coupled to topside substrate pads of the package substrate that are connected by vertical connectors to bottomside BGA substrate pads. The substrate carrier includes through-holes aligned with the bottomside BGA substrate pads for allowing probe contact to the BGA substrate pads.

The contactable TSV tips on the bottomside of the TSV die are contacted with a topside coupler that comprises a pattern of coupling terminals that matches a layout of at least a portion of the TSV tips, or matches a layout of pads that are coupled to the TSV tips. The topside coupler includes lateral connection circuitry that electrically connects pairs of coupling terminals to provide a plurality of TSV loop back paths. The BGA substrate pads which are coupled to the frontside of the TSVs are contacted with a plurality of probes that extend through the through-holes of the substrate carrier. The electronic assembly is electrically tested to obtain at least one test parameter.

DETAILED DESCRIPTION

Figure 1:
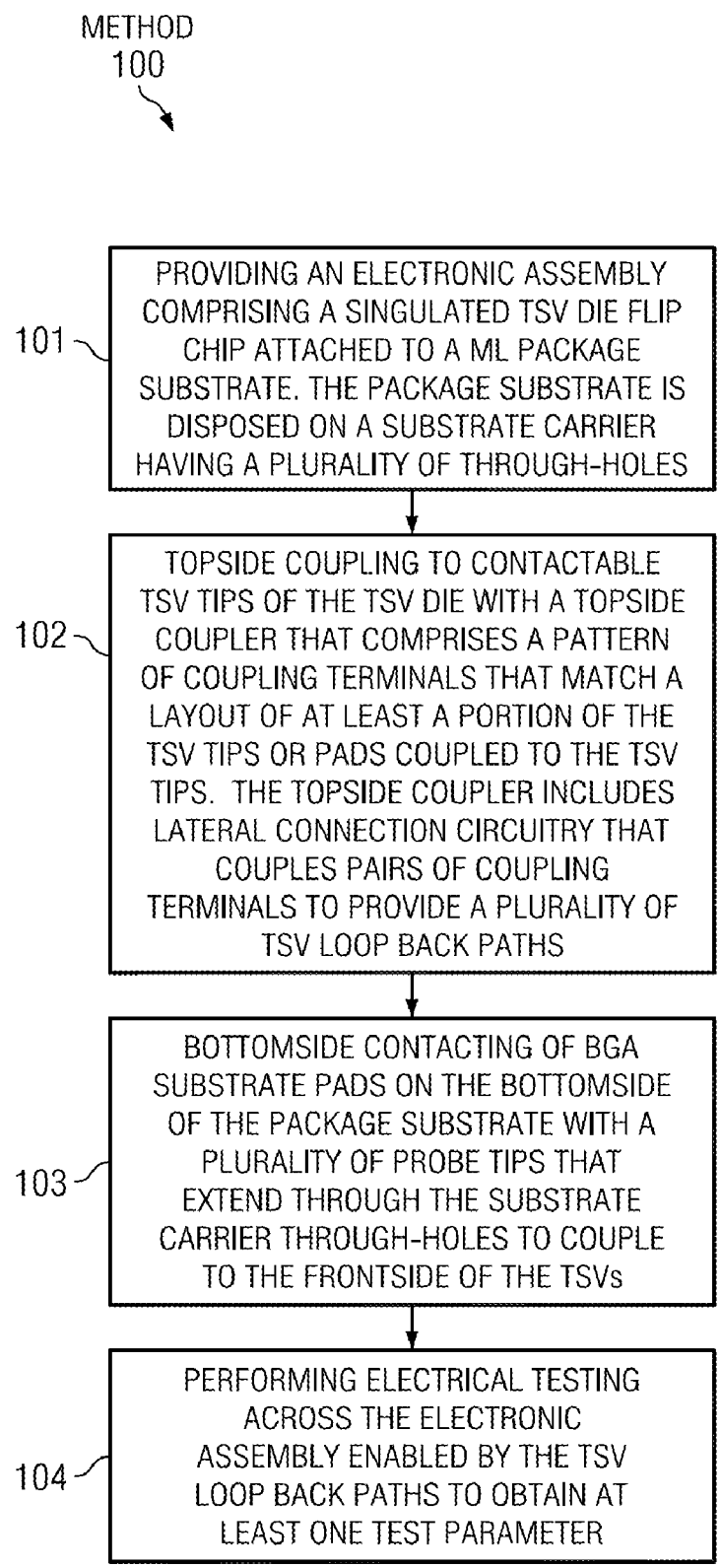
FIG. 1 is a flow chart that shows steps in an exemplary method for testing an electronic assembly comprising a singulated TSV die flip chip attached to a ML package substrate, that is disposed on a substrate carrier, according to an embodiment of the invention.

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 1 is a flow chart that shows steps in an exemplary method 100 for testing an electronic assembly on a substrate carrier, according to a disclosed embodiment. Step 101 comprises providing an electronic assembly comprising a singulated TSV die flip chip attached to a ML package substrate, that is disposed on a substrate carrier that has a plurality of through-holes. The electronic assembly on the substrate carrier may be recognized as the PoP precursor described above. The ML package substrate can comprises an organic substrate or a ceramic substrate. The ML package substrate can comprises a singulated substrate or a substrate panel comprising a plurality of physically connected ML package substrates.

The TSVs extend from a BEOL metal layer (e.g., M1, M2, etc.) within a frontside of the TSV die to a bottomside of the TSV die that includes contactable TSV tips. The frontside of the TSVs are coupled to topside substrate pads of the package substrate, and the topside substrate pads are coupled to bottomside BGA substrate pads.

The through-holes of the substrate carrier are aligned with the bottomside BGA substrate pads. The substrate carrier can comprise a dielectric, such as silica. In another embodiment, the substrate carrier comprises a semiconductor, with the through holes lined with a dielectric layer, such as silicon oxide.

Step 102 comprises topside coupling to the contactable TSV tips with a topside coupler that comprises a pattern of coupling terminals that match a layout of at least a portion of the TSV tips or a layout of pads coupled to the TSV tips, such as pads on the TSV tips or pads lateral to the TSV tips using an RDL. The topside coupler includes lateral connection circuitry that couples pairs of coupling terminals to provide a plurality of TSV loop back paths. The topside coupling can comprise a physical contact-method or a non-contact coupling method. Exemplary non-contact methods include SEM voltage contrast and capacitively-coupled probing.

When the topside coupling comprises topside contacting the coupling terminals are generally referred to herein as contactor contacts. Physical contact-methods (hereafter "contact methods") involve contact mechanisms that mate the contactor contacts to the TSV tips or pads coupled to the TSVs, such as contactor contacts comprising bumps/balls, or tips. In one embodiment the bumps/balls or tips comprise a metal that is softer than the TSV metal (e.g., copper) to allow multiple touchdowns without resulting in measurable mechanical damage to the TSV tips. The topside contacting can be provided by a wafer translator that can include translator tips. In one embodiment the topside contactor comprises a "wafer translator", such as based on the wafer translator described in U.S. Pat. No. 7,579,852 to Johnson. In another embodiment the translator tips comprise MEMS coil-spring contact tips that can accommodate some significant (e.g., 2 µm, or more) height variation in TSV tip height across the TSV die for embodiments where the contactable TSV tips comprises protruding TSV tips.

Step 103 comprises bottomside contacting of the BGA substrate pads on the bottomside of the package substrate with a plurality of probe tips that extend through the substrate carrier through-holes to couple for electrical contact to the frontside of the TSVs. The substrate carrier through-holes allow a large pitch probe card to contact the test the BGA substrate pads. The frontside of the TSVs can include exposed TSV tips or pads coupled the TSV tips. In one embodiment, TSVs can be re-routed to pillar pads having pillars thereon at top level metal or the next metal layer (i.e., M7 in an 8 level metal process).

In step 104 electrical testing is performed using a plurality of probes across the electronic assembly enabled by the TSV loop back paths to obtain at least one test parameter. The electrical testing can comprise (again) multi-probing the singulated TSV die and/or testing continuity of the plurality of TSVs to the package substrate and/or shorts between the plurality of TSVs and ground. The plurality of probes can comprise spring loaded pins, such as Pogo pins, which as known in the art slender cylinders containing two sharp, spring-loaded pins.

Figure 2A:
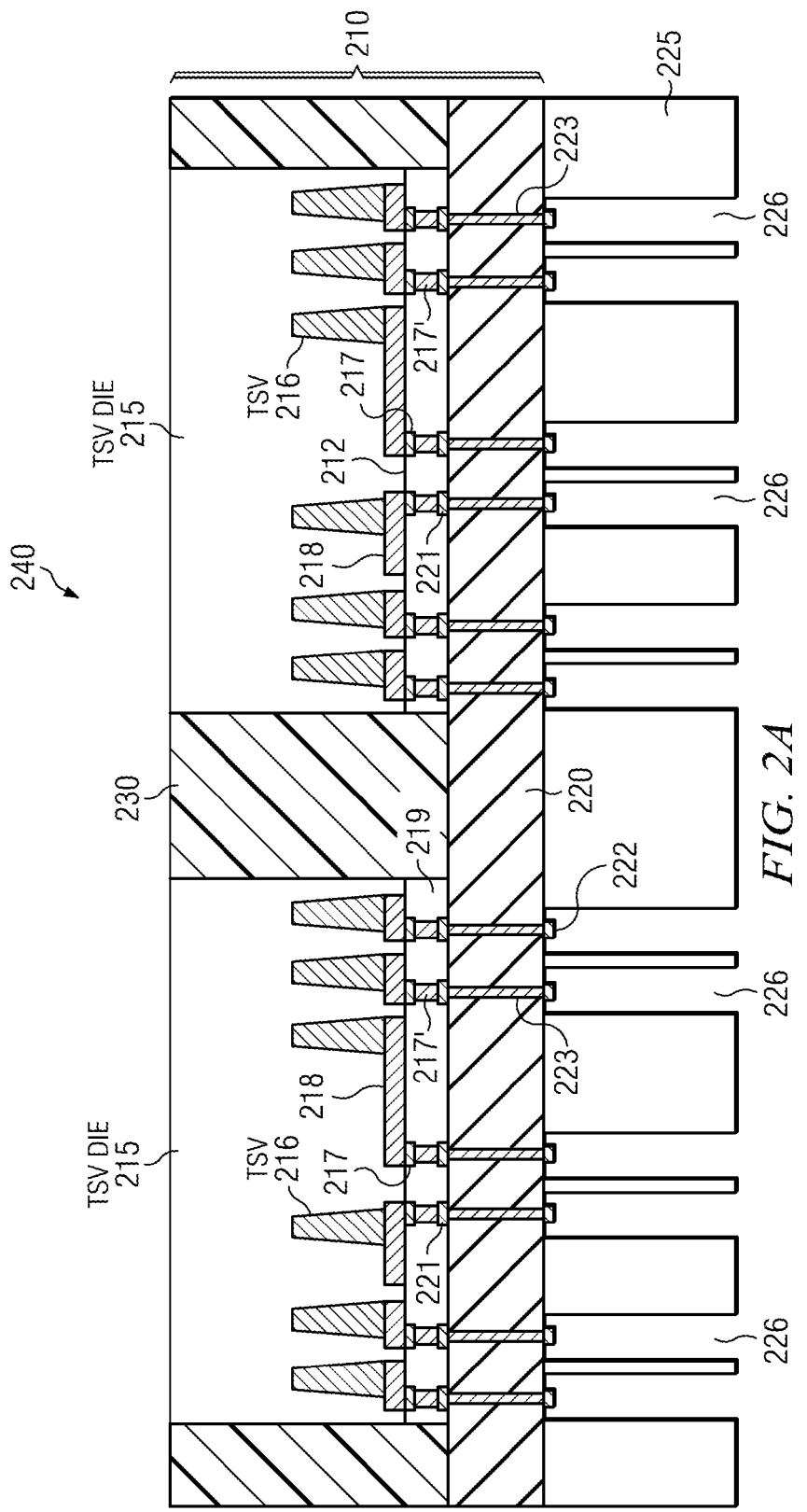
FIGS. 2A-C are cross sectional depictions of carrier supported electronic assemblies depicting several steps described relative to FIG. 1 for a contact TSV loop back testing method, according to a disclosed embodiment.
Figure 2B:
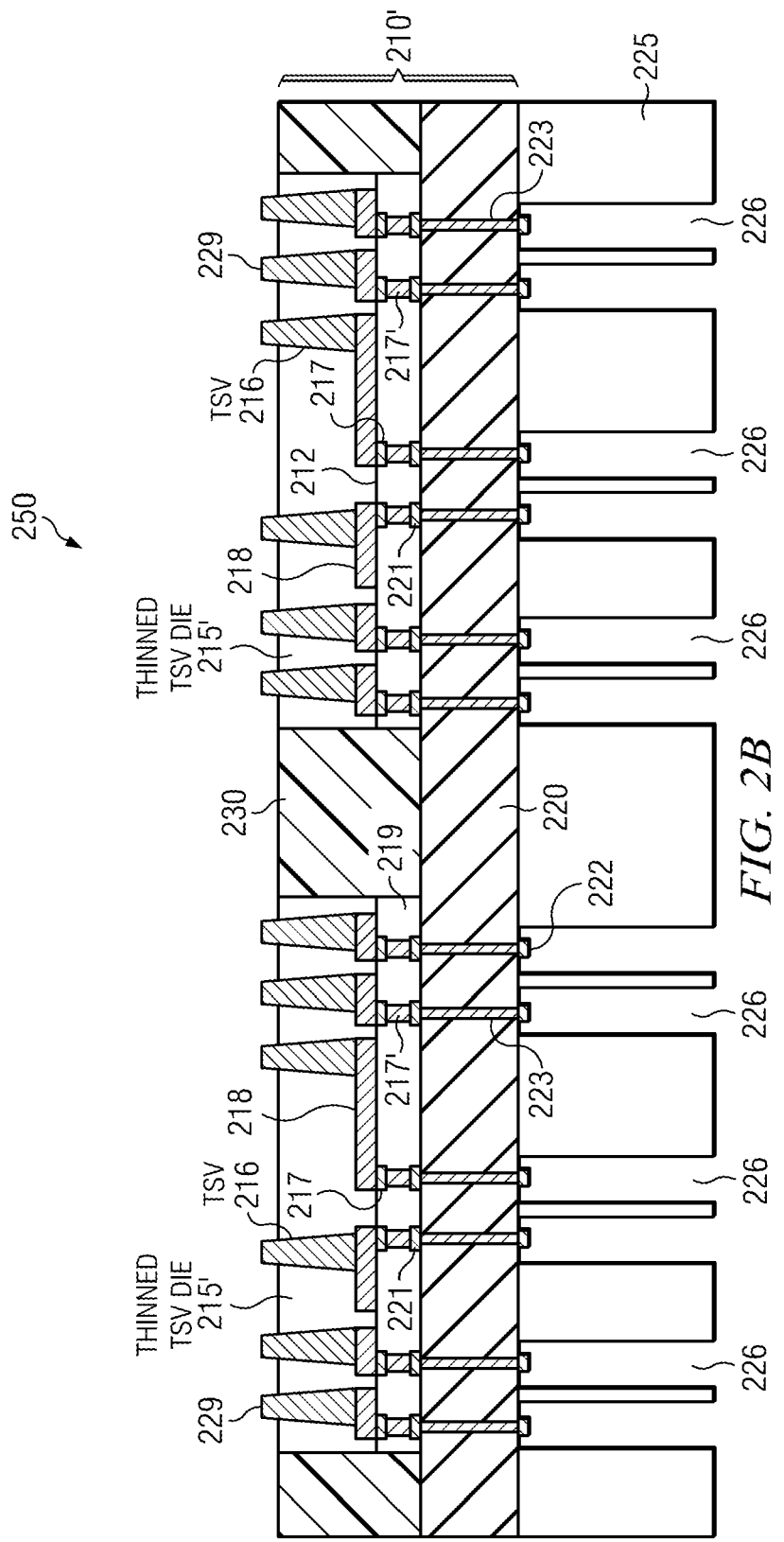
Figure 2C:
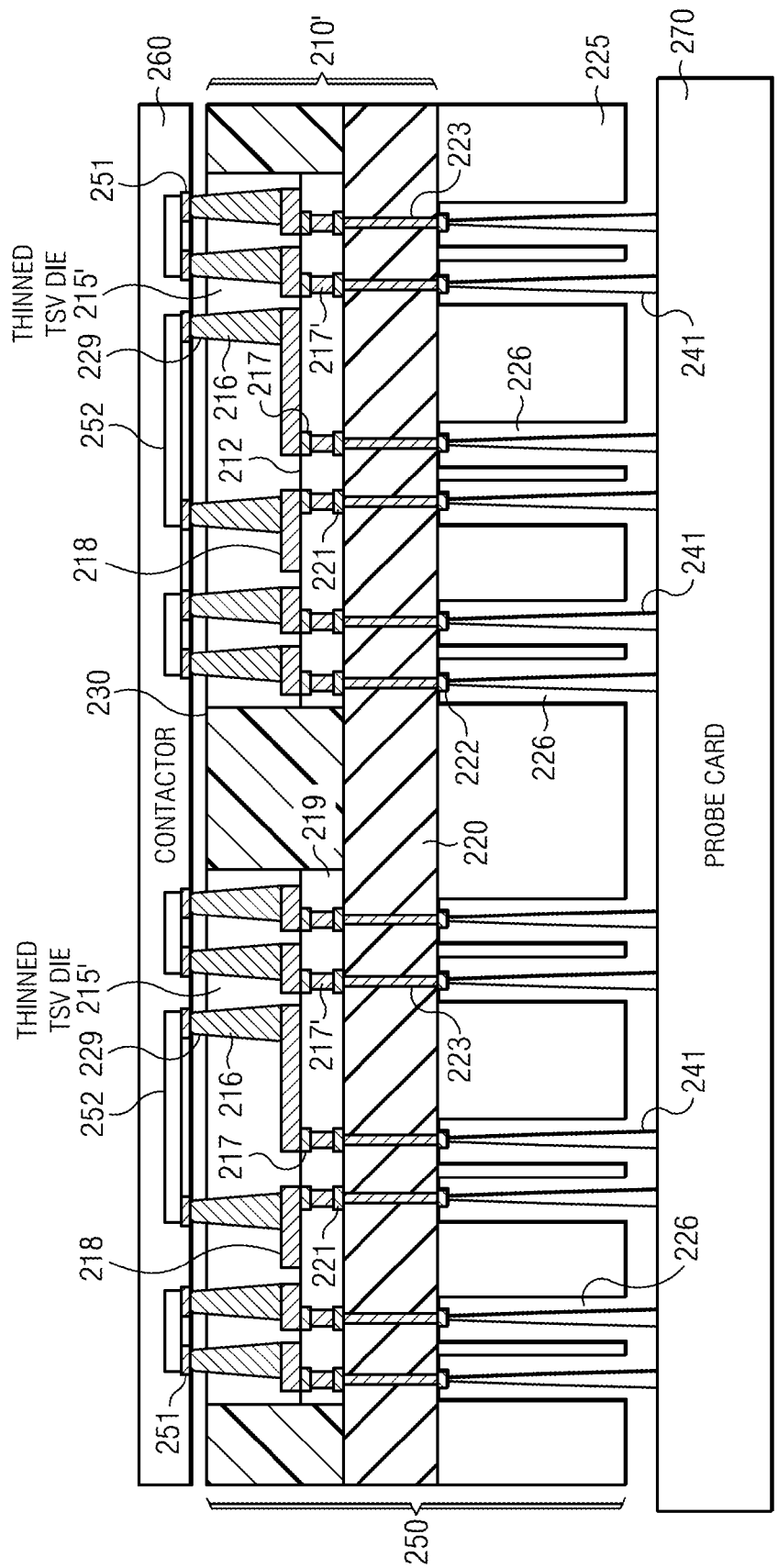

FIGS. 2A-C are cross sectional depictions of carrier supported electronic assemblies depicting several steps described relative to FIG. 1 for a contact TSV loop back testing method, according to a disclosed embodiment including depictions of several steps described relative to FIG. 1. FIG. 2A shows a cross sectional depiction of a carrier supported electronic assembly 240 comprising an electronic assembly 210 following the flip chip die attach of a singulated TSV die 215 comprising a frontside 212 to a ML package substrate 220, that is disposed on a substrate carrier 225.

The TSV die 215 is a thick die (typically 600 to 800 µm thick, or more) and includes a plurality of embedded TSVs 216. The frontside of the TSVs which are face-down as shown are coupled to pillar pads 217 and pillars 217' (e.g., copper pillars having solder on the tips) via BEOL metal layers 218, where the pillars 217' are coupled to topside substrate pads 221 of ML package substrate. The pillars 217' can be replaced by studs (e.g., gold studs) or bumps. The ML package substrate 220 also includes BGA substrate pads 222 and vertical paths 223 that couple the topside substrate pads 221 to the BGA substrate pads 222. Although shown as direct vertical paths, the paths can be indirect paths as well coupling is provided between the topside substrate pads 221 and the BGA substrate pads 222. Underfill 219, such as organic underfill, is lateral to the pillars 217' for filling the volume between the TSV die 215 and the package substrate 220 between the pillar joints to package substrate 220. The carrier 225 includes through-holes 226 for assembly testing that are aligned with the bottomside BGA substrate pads 222. Mold compound 230 is shown between the TSV die 215 for adding rigidity.

FIG. 2B shows a cross sectional depiction of a carrier supported thinned electronic assembly 250 following TSV exposure comprising a thinned electronic assembly 210' that includes thinned TSV die 215' having protruding TSV tips 229 that are thus directly contactable. The protruding TSV tips 229, which typically protrude a distance of 3 to 15 μm, provide the structure for bonding at least one die (e.g., a memory die) onto the thinned electronic assembly 210'. However, as noted above, the contactable TSV tip can be flush (non-protruding) or recessed (i.e., nearly flush), and coupled to by contacting pads that are over the TSV tip or laterally positioned pads which are contacted during testing.

TSV exposure to form protruding TSV tips 229, or more generally contactable TSV tips, can comprise backgrinding chemical mechanical polishing (CMP) and/or chemical etch. The thickness of the thinned TSV die 215' is generally <200 μm after TSV exposure, generally being 40 to 100 μm thick. As described relative to FIG. 2C below, the through-holes 226 in substrate carrier 225 adapts the carrier supported thinned electronic assembly 210' to be tested before addition of the top die.

FIG. 2C shows a cross sectional depiction of the carrier supported thinned electronic assembly 250 shown in FIG. 2B with a probe system including a probe card 270 comprising a plurality of probe needles 241 contacting one side of the thinned electronic assembly 210' to access the frontside 212 of the TSVs 216 and a topside contactor 260 contacting the contactable TSV tips shown as protruding TSV tips 229 on the bottomside of the thinned TSV die 215'. The contactor contacts 251 of the topside contactor 260 have incorporated circuitry 252 to electrically connect to other contacts. The topside contactor 260 can be vacuum held in place during testing, and removed after testing.

In one embodiment, the probe needles 241 of probe card 270 are spring loaded pins, such as Pogo pins. The thinned electronic assembly 210' is tested which allows testing of the thinned TSV die 215' while attached to the ML package substrate 220 to determine one or more test parameters including parameters associated with the die attach process while the substrate carrier 225 is present. Defective thinned electronic assemblies 210' can be identified and scrapped so that the outgoing product quality is substantially improved as compared to the conventional no-test at this intermediate assembly point.

As described above, the thinned PoP precursor is then shipped to a customer, and the customer (or its contactor) then (i) adds one or more die (e.g. a memory die) on top of the TSV die to make contact with the TSV tips 229 or pads coupled to the contactable TSV tips to form the PoP, and then (ii) the customer (or its contactor) removes the substrate carrier 225 and adds a BGA on the BGA substrate pads 222 of the package substrate.

It is possible to reuse the through-hole comprising substrate carriers disclosed herein. If used on a plurality of different devices, the through-hole comprising substrate carriers disclosed herein may be marked using appropriate marking (e.g. laser marking) to facilitate identification.

The active circuitry formed on the top semiconductor surface of the ICs can comprise circuit elements that generally include transistors, diodes, capacitors, and resistors, as well as signal lines and other electrical conductors that interconnect these various circuit elements. Disclosed embodiments can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, disclosed embodiments can be used in a variety of processes including bipolar, CMOS, BiCMOS and MEMS.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

We claim:

1. A method of testing an electronic assembly on a substrate carrier, comprising:

providing said electronic assembly including a singulated through-substrate via (TSV) die flip chip attached to a multilayer (ML) package substrate that is disposed on said substrate carrier, wherein said singulated TSV die includes a plurality of TSVs that extend from a back end of the line (BEOL) metal layer within a frontside of said singulated TSV die to a bottomside of said singulated TSV die to a contactable TSV tip, wherein said frontside of said TSVs are coupled to topside substrate pads of said package substrate that are coupled to bottomside BGA substrate pads, and wherein said substrate carrier includes through-holes aligned with said bottomside BGA substrate pads;

topside coupling to said contactable TSV tips with a topside coupler that comprises a pattern of coupling terminals that matches a layout of at least a portion of said contactable TSV tips or pads coupled to said contactable TSV tips, and wherein said topside coupler includes lateral connection circuitry that couples pairs of said coupling terminals to provide a plurality of TSV loop back paths;

bottomside contacting said BGA substrate pads with a plurality of probe tips that extend through said through-holes to couple to said frontside of said TSVs, and performing electrical testing across said electronic assembly to obtain at least one test parameter.

2. The method of claim 1, wherein said contactable TSV tips comprise protruding TSV tips.

3. The method of claim 1, wherein said substrate carrier comprises a dielectric.

4. The method of claim 1, wherein said ML package substrate comprises an organic substrate.

5. The method of claim 1, wherein said ML package substrate comprises a singulated substrate.

6. The method of claim 1, wherein said ML package substrate comprises a substrate panel comprising a plurality of said ML package substrates, and said singulated TSV die comprises a plurality of said singulated TSV die.

7. The method of claim 1, wherein plurality of probes comprise spring loaded pins.

8. The method of claim 1, wherein said electrical testing comprises multi-probing said singulated TSV die.

9. The method of claim 1, wherein said test parameter comprises at least one of (i) continuity of said plurality of TSVs to said package substrate and (ii) shorts between said plurality of TSVs and ground.

10. The method of claim 1, wherein said frontside of said TSVs are coupled to pillars, and wherein said pillars are coupled to said topside substrate pads of said package substrate.

11. The method of claim 1, wherein said topside coupling comprises topside contacting and said coupling terminals comprise contactor contacts.

12. The method of claim 11, wherein said topside contacting is provided by a wafer translator.

13. The method of claim 12, wherein said wafer translator comprises translator tips.

14. The method of claim 13, wherein said translator tips comprise MEMS coil-spring contact tips.

15. The method of claim 11, wherein said contactor contacts comprise bumps.

16. The method of claim 1, wherein said topside coupling comprises a non-contact coupling method.

17. The method of claim 16, wherein said non-contact coupling method comprises SEM voltage contrast or capacitively-coupled probing.

18. A carrier supported electronic assembly having structure for adding at least one top integrated circuit (IC) die thereon that is adapted for testing said electronic assembly before addition of said top IC die, comprising:
   a substrate carrier;
   a multilayer (ML) package substrate on said substrate carrier having topside substrate pads that are coupled to bottomside BGA substrate pads, and
   at least one singulated through-substrate via (TSV) die flip chip attached to a multilayer (ML) package substrate, wherein said singulated TSV die includes a plurality of TSVs that extend from a back end of the line (BEOL) metal layer within a frontside of said singulated TSV die to a contactable TSV tip on a bottomside of said singulated TSV die,
   wherein said frontside of said TSVs are coupled to topside substrate pads of said ML package substrate, and
   wherein said substrate carrier includes through-holes aligned with said bottomside BGA substrate pads.

19. The electronic assembly of claim 18, wherein said substrate carrier comprises a dielectric and said ML package substrate comprises an organic substrate.

20. The electronic assembly of claim 18, wherein said substrate carrier comprises a semiconductor, and wherein said through-holes are lined with a dielectric layer.

21. The electronic assembly of claim 18, wherein said ML package substrate comprises a substrate panel comprising a plurality of said ML package substrates, and said singulated TSV die comprises a plurality of said singulated TSV die.

22. The electronic assembly of claim 18, wherein said contactable TSV tips comprise protruding TSV tips.

* * * * *